US006549453B2

(12) United States Patent
Wong

(10) Patent No.: US 6,549,453 B2
(45) Date of Patent: Apr. 15, 2003

(54) METHOD AND APPARATUS FOR WRITING OPERATION IN SRAM CELLS EMPLOYING PFETS PASS GATES

(75) Inventor: Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/896,745

(22) Filed: Jun. 29, 2001

(65) Prior Publication Data
US 2003/0002329 A1 Jan. 2, 2003

(51) Int. Cl.[7] ............................................. G11C 11/00
(52) U.S. Cl. ................................... 365/156; 365/154
(58) Field of Search ........................... 365/156, 154, 365/51

(56) References Cited

U.S. PATENT DOCUMENTS

| | | |
|---|---|---|
| 5,034,923 A | 7/1991 | Kuo et al. |
| 5,276,647 A | 1/1994 | Matsui et al. |
| 5,428,574 A | 6/1995 | Kuo et al. |
| 5,559,745 A | 9/1996 | Banik et al. |
| 5,835,429 A | 11/1998 | Schwarz |
| 5,956,279 A | 9/1999 | Mo et al. |
| 6,026,011 A | 2/2000 | Zhang |
| 6,205,049 B1 * | 3/2001 | Lien et al. ............... 365/154 |
| 6,216,239 B1 | 4/2001 | Lien |

* cited by examiner

Primary Examiner—Richard Elms
Assistant Examiner—Hien Nguyen
(74) Attorney, Agent, or Firm—Daryl K. Neff; Cantor Colburn LLP

(57) ABSTRACT

A method for preparing a computer memory cell for a data write operation thereto is disclosed. The memory cell has a cell supply voltage source which is connected at one end to pull-up devices within the memory cell, and is connected at an opposite end to pull-down devices within the memory cell. The memory cell further has a pair of access transistors for selectively coupling the memory cell to a pair of complementary bitlines. In an exemplary embodiment, the method includes adjusting the voltage of the cell supply voltage source from a first voltage value to a second voltage value, the second voltage value being less than the first voltage value. The memory cell is then coupled to the pair of complementary bitlines, thereby facilitating the data write operation. Following the data write operation, the cell supply voltage is restored from the second voltage value back to the first voltage value.

40 Claims, 6 Drawing Sheets

DUAL-PORT SRAM CELL
1.12 X 1.54 = 1.72 (VS 0.91 X 1.33 = 1.21)
n-port beta = 1.69
p-port reverse beta = 1

METHOD AND APPARATUS FOR WRITING OPERATION IN SRAM CELLS EMPLOYING PFETS PASS GATES

BACKGROUND

The present invention relates generally to integrated circuit memory devices and, more particularly, to a method and apparatus for implementing a writing operation in Static Random Access Memory (SRAM) cells employing PFET pass gates.

A typical static random access memory (SRAM) cell includes an array of individual SRAM cells. Each SRAM cell is capable of storing a binary voltage value therein, which voltage value represents a logical data bit (e.g., "0" or "1"). One existing configuration for an SRAM cell includes a pair of cross-coupled devices such as inverters. With CMOS (complementary metal oxide semiconductor) technology, the inverters further include a pull-up PFET (p-channel) transistor connected to a complementary pull-down NFET (n-channel) transistor. The inverters, connected in a cross-coupled configuration, act as a latch which stores the data bit therein so long as power is supplied to the memory array. In a conventional six-transistor cell, a pair of access transistors or pass gates (when activated by a word line) selectively couple the inverters to a pair of complementary bit lines.

FIG. 1 illustrates a conventional SRAM cell structure 100 which represents a single memory cell included within a memory array arranged in rows and columns. The SRAM cell structure 100 includes a six-transistor memory cell 102 which is capable of storing a binary bit of information. Specifically, the memory cell includes a pair of cross-coupled, complementary metal oxide semiconductor (CMOS) inverters. One inverter includes an NFET storage transistor N1 and a PFET load transistor P1. Similarly, a second inverter includes an NFET storage transistor N2 and a PFET load transistor P2. Transistors P1 and P2 are often referred to as pull-up transistors because of their coupling to the voltage source $V_{DD}$. Transistors N1 and N2 are similarly referred to as pull-down transistors because of their coupling to ground. The memory cell 102 further contains NMOS access transistors (i.e., pass gates) NL and NR serving as switches, each of which are coupled between the bistable circuit (P1, N1, P2 and N2) and a pair of complementary bit lines BL and BR, respectively. Pass gates NL and NR are activated by an appropriate signal generated on a wordline WL.

While conventional SRAM cells typically employ NFETs for the pass gates, PFET pass gates have also been proposed for better stability, lower power and a substantially higher density for multi-port layouts. As a consequence of better stability, however, some difficulties may be experienced in writing through a PFET port. With decreased conductivity of smaller PFET pass gates, it takes longer for the node voltage within the cell to be pulled high or low. For a specific type of CMOS technology where the threshold voltage ($V_T$) is about the same for both PFETs and NFETs, a reverse beta ratio of at least 1.8 in the layout is desired in order to provide the SRAM cell with acceptable write performance under worst case conditions. The reverse beta ratio for a PFET pass gate is defined as the ratio of the (W/L) of the PFET pass gate over the (W/L) of the pull-down NFET. Moreover, a beta ratio for a conventional SRAM cell (the beta ratio being defined as the ratio of the (W/L) of the pull-down NFET over the (W/L) of the NFET pass gate) of at least 1.8 is needed for stability.

In an exemplary layout for an SRAM cell having PFET pass gates, a PFET pass gate may have a width W≈0.16 μm and a length L≈0.08 μm. For low power applications, a more desired PFET pass gate configuration would be to have devices with a narrower width and a longer channel (e.g., W≦0.11 μm and L≧0.10 μm) so that off currents in a standby mode may be minimized. However, if such PFET pass gate dimensions were so implemented, the pull-down NFET would be much longer in order to maintain a reverse beta ratio ≧2, and thus the corresponding overall cell size would be increased, perhaps by as much as 20%. In the meantime, the read performance of the cell would be degraded.

BRIEF SUMMARY

The above discussed and other drawbacks and deficiencies of the prior art are overcome or alleviated by a method for preparing a computer memory cell for a data write operation thereto. The memory cell has a cell supply voltage source which is connected at one end to pull-up devices within the memory cell, and is connected at an opposite end to pull-down devices within the memory cell. The memory cell further has a pair of access transistors for selectively coupling the memory cell to a pair of complementary bitlines. In an exemplary embodiment, the method includes adjusting the voltage of the cell supply voltage source from a first voltage value to a second voltage value, the second voltage value being less than the first voltage value. The memory cell is then coupled to the pair of complementary bitlines, thereby facilitating the data write operation. Following the data write operation, the cell supply voltage is restored from the second voltage value back to the first voltage value.

In one embodiment, the first voltage value corresponds to the pull-up devices within the memory cell being coupled to a logic supply voltage $V_{DD}$, and the pull-down devices within the memory cell being removably coupled to ground. The second voltage value corresponds to the pull-down devices being floated up to a potential above ground, thereby reducing the magnitude of the voltage of the cell supply voltage source. In an alternative embodiment, the first voltage value corresponds to the pull-up devices within the memory cell being removably coupled to a logic supply voltage $V_{DD}$, and the pull-down devices within the memory cell being coupled to ground. The second voltage value corresponds to the pull-up devices being floated down to a potential below $V_{DD}$, thereby reducing the magnitude of the voltage of the cell supply voltage source.

BRIEF DESCRIPTION OF THE DRAWINGS

Referring to the exemplary drawings wherein like elements are numbered alike in the several Figures.

DETAILED DESCRIPTION

One possible solution to the above discussed drawbacks would be to implement a write scheme for a PFET pass gate SRAM cell having a reverse beta ratio of about 1. A "ratioless" SRAM cell layout may implemented, for example, by providing high voltage threshold ($V_{TN}$) implants for the NFET and/or low voltage threshold implants ($V_{TP}$) for the PFET, such that $V_{TN}$ is over three times $V_{TP}$. Alternatively, the bias of the N-well and/or the P-well of the devices might be manipulated to produce a PFET pass gate which is twice as conductive as the pull-down NFET. However, such proposals result in lengthy process development and increased manufacturing costs.

Therefore, in accordance with an embodiment of the invention, there is disclosed a method and apparatus for implementing a write scheme for an SRAM cell having PFET pass gates, which write scheme allows for quick and reliable write performance within a ratioless layout. Thereby, lower off-currents for the pass gates, as well as higher cell density (particularly for multiport designs), are realized without sacrificing write performance.

Figure 1:
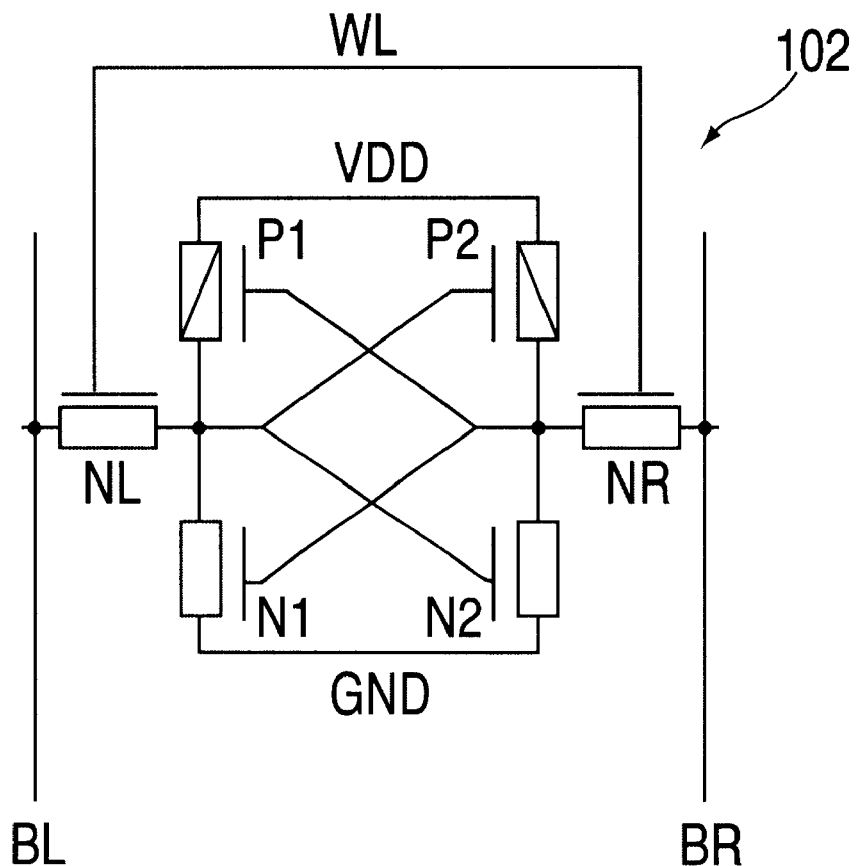
FIG. 1 is a schematic of an existing six-transistor SRAM cell structure.
Figure 2:
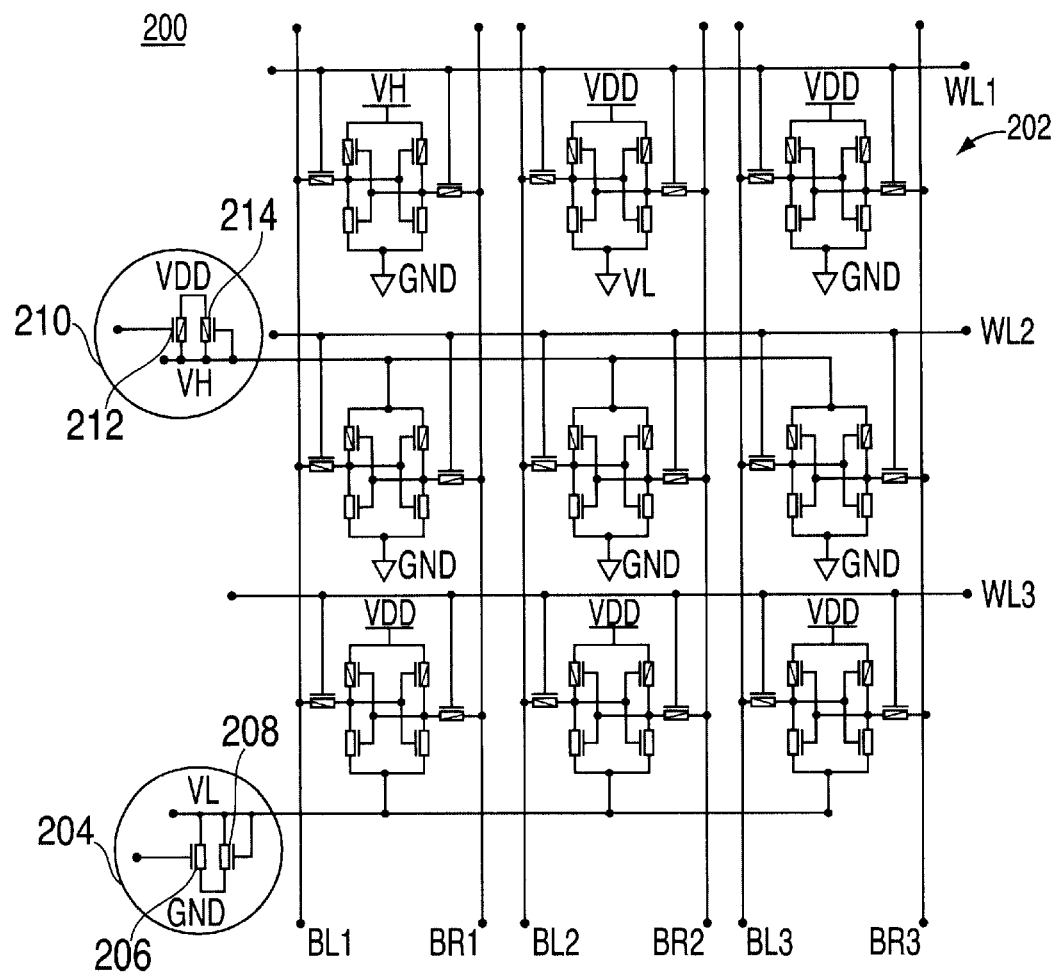
FIG. 2 is a schematic of a partial SRAM cell array, illustrating various possible circuit configurations for implementing an SRAM write operation, in accordance with an embodiment of the invention.

Referring initially to FIG. 2, there is shown a partial SRAM cell array 200 which illustrates various possible circuit configurations for implementing the presently disclosed write schemes. Array 200 includes a plurality of individual SRAM cells 202 which are each capable of storing a bit of information therein. The SRAM cells 202 are similar to that shown in FIG. 1, with the exception that the pass gates in cells 202 comprise PFETs. For purposes of illustration only, cell array 200 shows nine individual cells 202 arranged in three rows and three columns. Each cell is connected to a wordline (WL1, WL2 or WL3), as well as a pair of complementary bitlines (BL1-BR1, BL2-BR2 or BL3-BR3). In order to access a particular cell, the particular wordline associated therewith is activated, and a read or write or operation may be executed.

In each of the following described writing scheme embodiments, the magnitude of the cell voltage supply is manipulated (i.e., reduced) in some manner from the normal logic supply voltage (e.g., $V_{DD}$ and ground), such that a smaller PFET pass gate device size used in a ratioless layout will still allow for an effective write operation. Further, it will be noted that the following writing scheme embodiments are each described with reference to FIG. 2:

(A) Float $V_L$ Up Above Ground by One $V_T$

In this embodiment, the pull-down NFETs in each cell are floated upward from ground potential during a write operation thereto. Rather than connecting the pull-down NFETs in each cell directly to ground, they are connected to a common line $V_L$. In turn, $V_L$ is removably coupled to ground, with $V_L$ floating above ground only during a write operation, and connected to ground at all other times. The pull-up PFETs within the cell remain connected to $V_{DD}$. This embodiment is shown implemented in the bottom row (along WL3) of the array 200 in FIG. 2.

More specifically, a switching mechanism 204 includes a NFET switch 206 connected between $V_L$ and ground. In addition, another NFET 208 is configured as a diode, having both its drain terminal and gate terminal connected to $V_L$. During a non-writing mode, an input signal on the gate terminal of NFET switch 206 is equal to $V_{DD}$, thereby causing NFET switch 206 to be conductive and thus pulling $V_L$ down to ground. The magnitude of cell voltage in this instance is equivalent to $V_{DD}$ (e.g., 1.2 volts) However, during a write operation, the input signal goes to low or ground, thereby turning NFET switch 206 off. As a result, NFET 208, configured as a diode, causes the potential at $V_L$ to rise above ground by a voltage equivalent to the threshold voltage of the NFET device (e.g., 0.36 volts).

Figure 3:
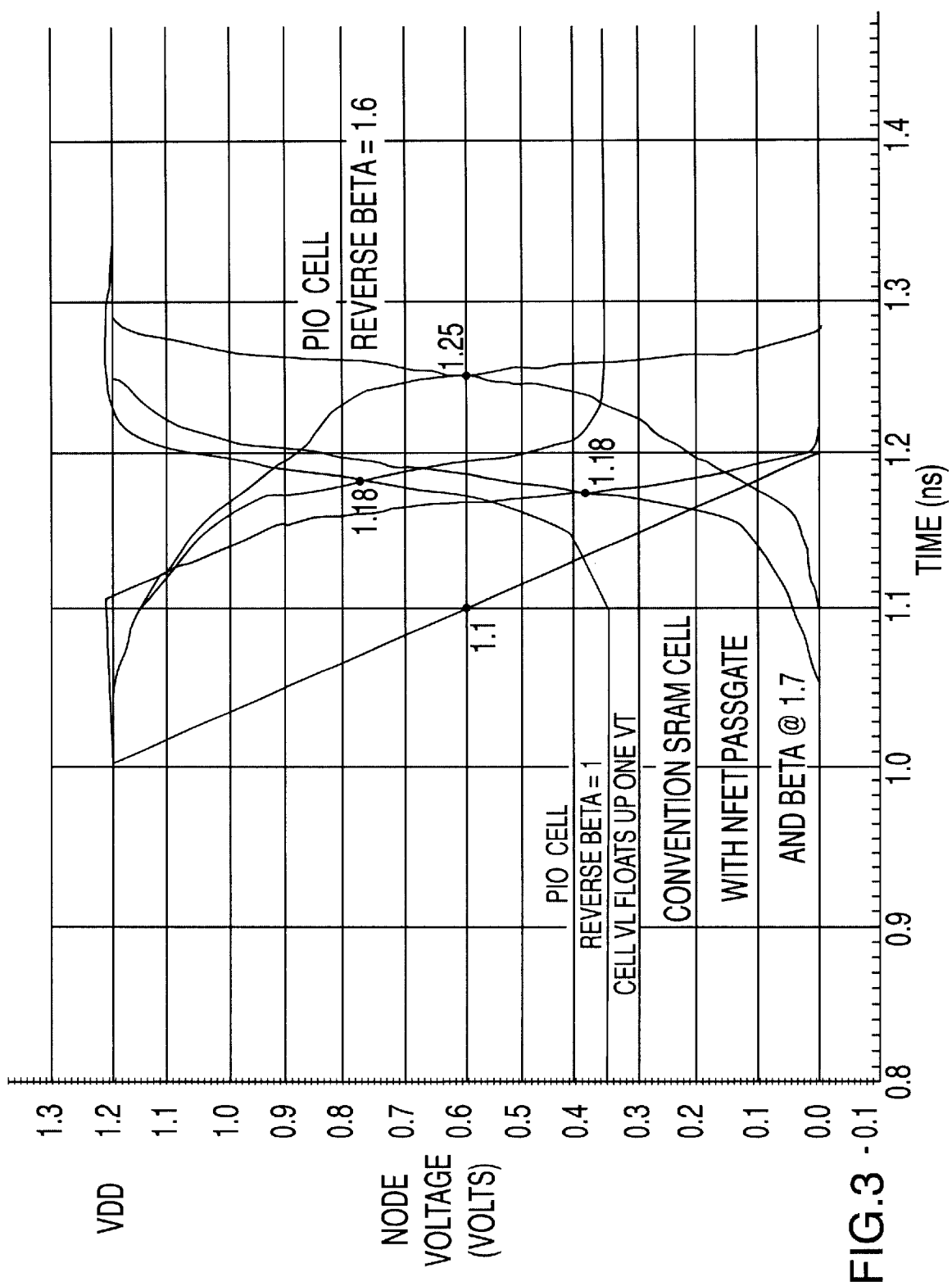
FIG. 3 is a graph which illustrates a comparison of cell writing operations between a conventional NFET pass gate SRAM cell and a PFET pass gate SRAM cell configured according to an embodiment of the invention.

The effect of raising the potential at $V_L$ is to reduce the magnitude of the voltage swing needed (and hence the amount of time needed) within the cell node to flip the bit from "0" to "1" or vice versa. FIG. 3 is a graph which illustrates a comparison of cell writing operations between a conventional NFET pass gate SRAM cell (with a beta ratio of about 1.7) and a PFET pass gate SRAM cell configured according to embodiment (A) (with a reverse beta ratio of about 1.0). As seen from the graph, the transition time for flipping the bit for the conventionally configured cell with NFET pass gates is about 1.18 nanoseconds (ns). That is, the curves illustrating a write operation from logic 0 (at ground) to logic 1 (at $V_{DD}$), and vice versa, intersect at about 1.18 ns. The write operation is initiated with the wordline transition at about 0.11 ns, with the voltage on the wordline switching from $V_{DD}$ at about 1.0 ns to ground at about 1.2 ns.

In contrast, an SRAM cell with PFET pass gates and a reverse beta ratio smaller than 1.7 becomes more difficult to write thereto, due to the relatively decreased conductivity of the pass gates as their dimensions get smaller. However, by floating the value of $V_L$ up above ground by about one $V_T$, the lesser the voltage swing is needed to flip the stored bit within the cell node. This is also shown in FIG. 3. By biasing the cell voltage such that a "0 write" operation pulls the node voltage from $V_{DD}$ at about 1.2 volts down to $V_L$ at about 0.36 volts, the transition time is once again about 1.18 ns. While it is true that by manipulating (reducing) the magnitude of the cell voltage supply with respect to the logic supply decreases the stability of the cell, switching mechanism 204 ensures the "floating" operation occurs only during a write operation. Thus, during no operation or a read operation, the cell voltage supply is equivalent to the logic supply voltage, and adequate cell stability is maintained.

(B) Undershoot BR below $V_L$

In an alternative embodiment, the pull-down NFETs in each cell are connected to $V_L$ which, in turn, may be biased at ground or above ground. In either case, the writing speed to the cell may be increased by pulling the bitline level below the value of $V_L$. This scheme is shown implemented for the cell occupying the first row, second column of the array 200 in FIG. 2 (WL1, BL2/BR2). As in scheme (A), the pull-up PFETs in the cell are connected to $V_{DD}$. The pull-down NFETs are connected to $V_L$ which, in this embodiment, is a fixed voltage. One possibility is to have $V_L$ set at a potential slightly higher than ground, such as about 0.36 volts (one $V_T$). The bitline voltage swing placed on bitlines BL2 and BR2 in this instance can therefore be between $V_{DD}$ and ground.

Another possibility for this embodiment is to connect $V_L$ to ground. In this instance, the bitline swing would be between $V_{DD}$ and a potential below ground, such as −0.36 volts. In either case, the bitline or its complement (depending on which value is written into the cell) is pulled approximately one threshold voltage value ($V_T$) below the value of $V_L$. This has the effect of changing the internal cell node voltage at a faster rate and thereby quickening the write time to the cell. With this embodiment, the particular bias setting of $V_L$ (depending on the overall voltage budget) has its own advantages. For example, setting $V_L$ equal to ground renders the cell more stable than setting $V_L$ to one $V_T$ above ground. On the other hand, setting $V_L$ equal to ground may require additional circuitry to set the bitlines at one $V_T$ below ground potential.

(C) Float $V_H$ Down Below $V_{DD}$ by One $V_T$

The principles of this embodiment are similar to embodiment (A). Instead of floating the pull-down NFETs in each cell upward from ground potential during a write operation, the pull-up PFETs are floated downward from $V_{DD}$. As shown in the second row (WL2) of the array 200 in FIG. 2, the pull-up PFETs in each cell are connected to a common line $V_H$. In turn, $V_H$ is removably coupled to $V_{DD}$, with $V_H$ floating below ground only during a write operation, and connected to $V_{DD}$ at all other times. The pull-down NFETs within the cell remain connected to ground.

A switching mechanism 210 includes a PFET switch 212 connected between $V_H$ and $V_{DD}$. In addition, another PFET 214 is configured as a diode, having both its drain terminal and gate terminal connected to $V_H$. During a non-writing mode, an input signal on the gate terminal of PFET switch 212 is equal to ground, thereby causing PFET switch 212 to be conductive and thus pulling $V_H$ up to $V_{DD}$. The magnitude of cell voltage in this instance is equivalent to $V_{DD}$ (e.g., 1.2 volts) However, during a write operation, the input signal goes to high or $V_{DD}$, thereby turning PFET switch 212 off. As a result, PFET 214, configured as a diode, causes the potential at $V_H$ to drop below $V_{DD}$ by a voltage equivalent to the threshold voltage of the PFET device (e.g., 0.36 volts).

Once again, the effect of lowering the potential at $V_H$ is to reduce the magnitude of the voltage swing needed (and hence the amount of time needed) within the cell node to flip the bit from "0" to "1" or vice versa.

(D) Overshoot BL Above $V_H$

The principles of this embodiment are similar to embodiment (B). The pull-up PFETs in each cell are connected to $V_H$ which, in turn, may be biased at $V_{DD}$ or below $V_{DD}$. In either case, the writing speed to the cell may be increased by pulling the bitline charge above the value of $V_H$. This particular scheme is shown implemented for the cell occupying the first row, first column of the array 200 in FIG. 2 (WL1, BL1/BR1). As in scheme (C), the pull-down NFETs in the cell are connected to ground. The pull-up PFETs are connected to $V_H$ which, in this embodiment, is a fixed voltage. One possibility is to have $V_H$ set at a potential lower than $V_{DD}$ such as about 0.84 volts (one $V_T$ below $V_{DD}$). The bitline voltage swing placed on bitlines BL1 and BR1 in this instance can therefore be between $V_{DD}$ and ground.

Another possibility for this embodiment is to connect $V_H$ to $V_{DD}$. In this instance, the bitline swing would be between ground and a potential above $V_{DD}$, such as 1.56 volts. In either case, the bitline or its complement (depending on which value is written into the cell) is pulled approximately one threshold voltage value ($V_T$) above the value of $V_H$. This has the effect of changing the internal cell node voltage at a faster rate and thereby quickening the write time to the cell. With this embodiment, the particular bias setting of $V_H$ (depending on the overall voltage budget) has its own advantages. For example, setting $V_H$ equal to $V_{DD}$ renders the cell more stable than setting $V_H$ to one $V_T$ below $V_{DD}$. On the other hand, setting $V_L$ equal to $V_{DD}$ may require additional circuitry to set the bitlines at one $V_T$ above $V_{DD}$ potential. Furthermore, with embodiments (C) and (D), additional design care is desirable. In (D), there is a short path between the up bitline voltage level at $V_H + V_T$ and the cell supply level at $V_H$, after writing is complete. In the case of embodiment (C), there is a short path between the down bitline voltage level at $V_L - V_T$, and the cell supply at $V_L$.

Figure 4:
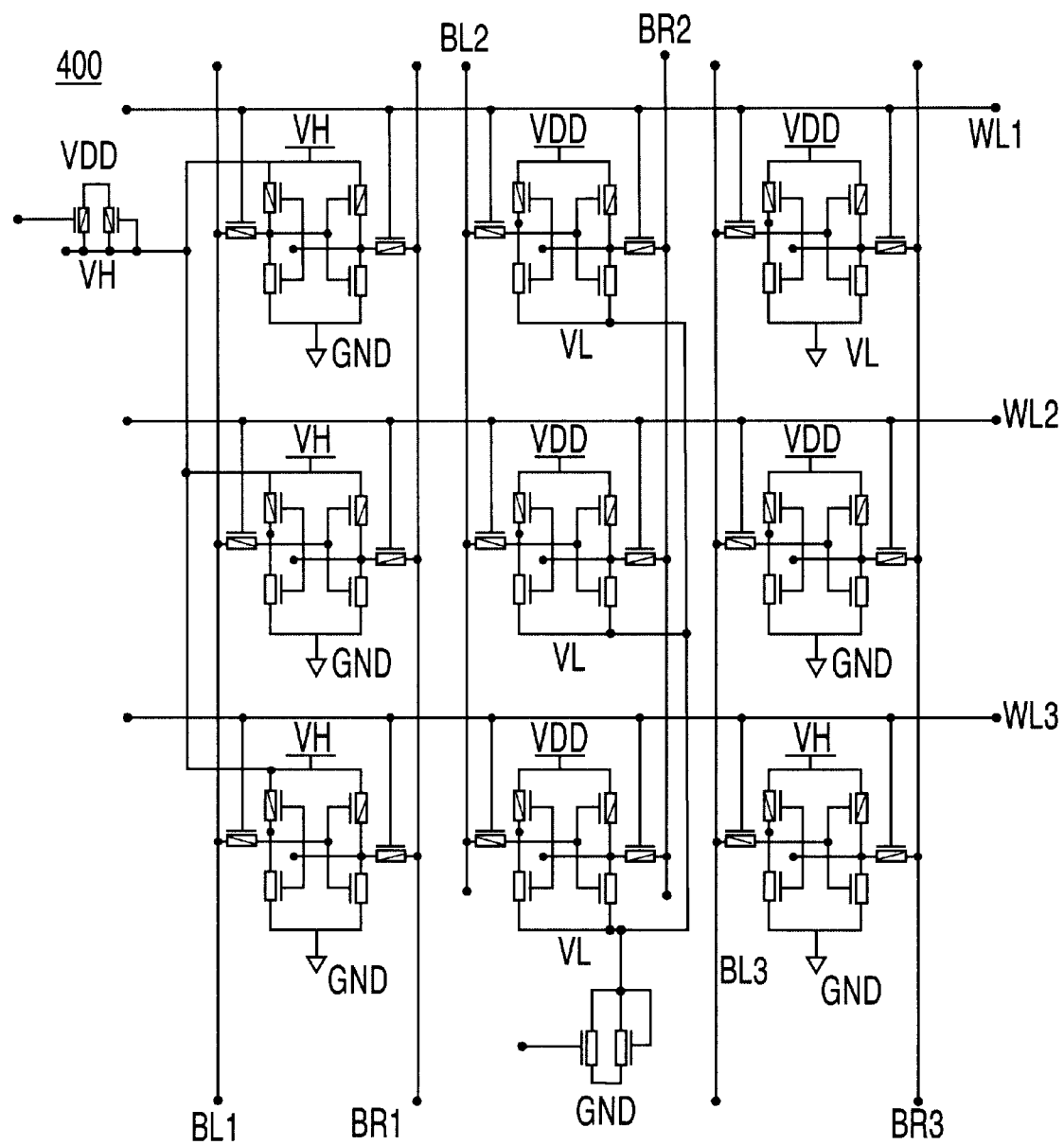
FIG. 4 is an alternative embodiment of the partial SRAM cell array shown in FIG. 2.

Referring now to FIG. 4, there is shown another partial SRAM cell array 400 which illustrates an alternative cell power supply arrangement to the array 200 of FIG. 2. In this embodiment, the cell supply lines ($V_H$, $V_L$ or both) are arranged vertically along cell columns instead of rows. The choice of the arrangement of cell voltage supply lines may depend upon the availability of metal lines, the specific application of the memory array and/or the designer's preferred style.

Figure 5A:
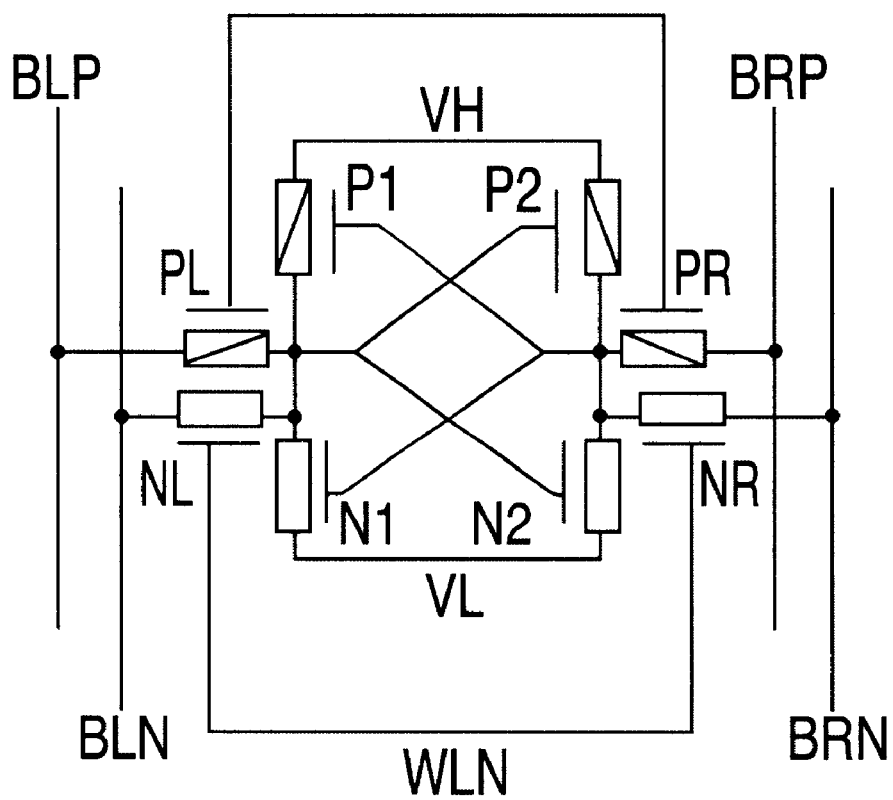
FIG. 5(a) is a schematic of a dual-port SRAM cell structure.

Finally, the above described cell arrangements may also be applied in dual-port SRAM applications. A schematic for an individual, dual-port SRAM cell is shown in FIG. 5(a). Cell 500 comprises an eight transistor cell, wherein there are two sets of pass gates, two wordlines and two pairs of complementary bitlines. Both sets of pass gates, 5 wordlines and bitlines provide independent access to the cell 500. In a dual-port SRAM, one port may be used for read or write operations, and the other port may also be used for read or write operations. For example, in the cell 500, a PFET read port comprises PFET pass gates PL and PR, activated by wordline WLP, which couples cell 500 to bitline pair BLP and BRP. An NFET write port comprises NFET pass gates NL and NR, activated by wordline WLN, which couples cell 500 to bitline pair BLN and BRN.

Figure 5B:
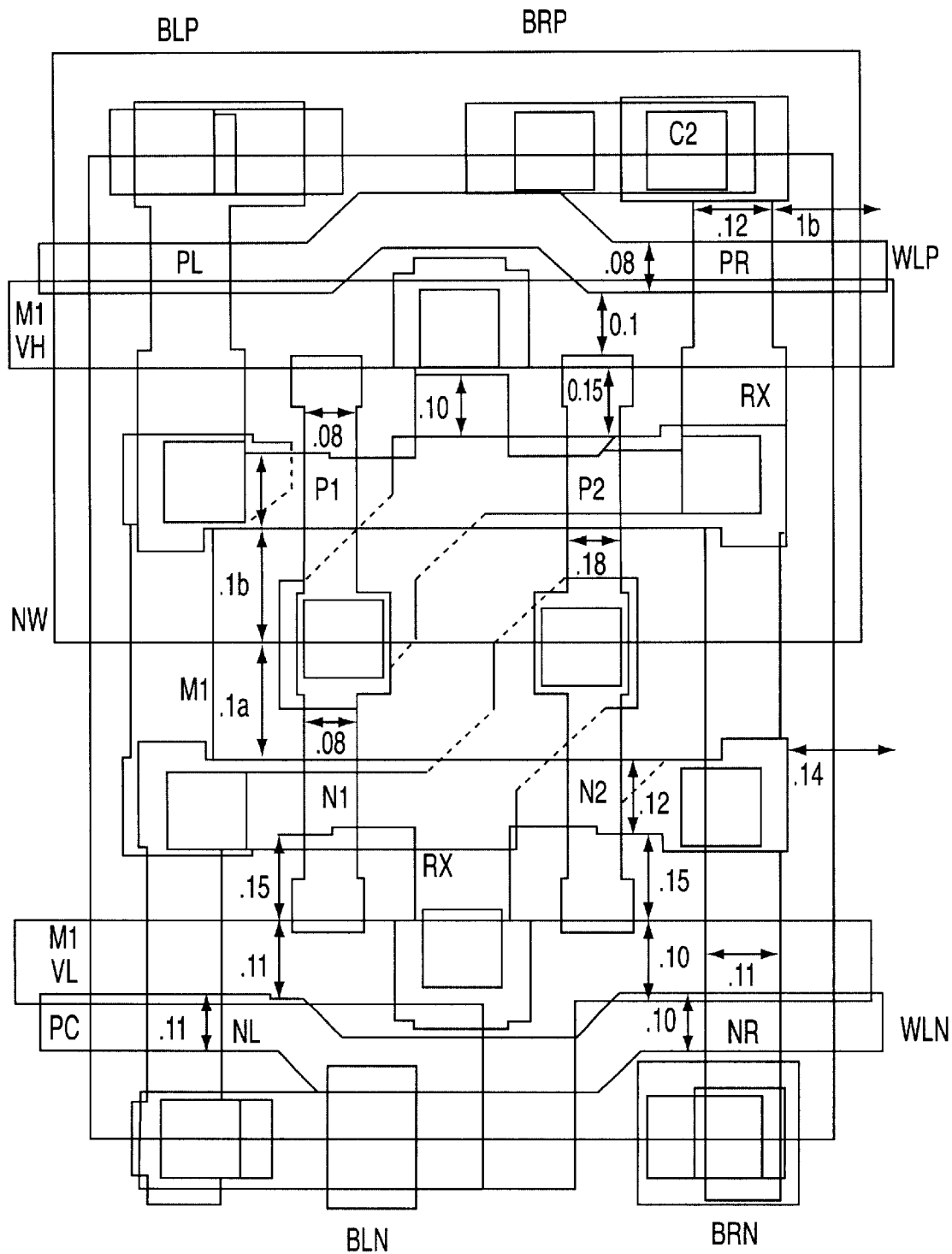
FIG. 5(b) is an area layout of the dual-port SRAM cell structure of FIG. 5(a).

In order to enable the PFET port to allow a reliable writing operation, the write acceleration schemes described herein are applied on one form or another. Otherwise, the PFET pass gate would necessarily be made much larger to provide a sufficiently large reverse beta ratio. Consequently, with bigger PFET pass gates, the pull-down NFETs increase in size to prevent access disturb, all at the cost of larger cell area and power dissipation. As shown in FIG. 5(b), dual-port cell 500 has an area layout of about $1.12 \mu m \times 1.54 \mu m \approx 1.72 \mu m^2$ (as compared to a conventional, single-port NFET cell with an area of about $1.21 \mu m^2$). The cell size is thus minimized without the concerns of reverse beta ratios.

It will be appreciated that the disclosed embodiments may be combined such both the high and low voltage supply connections within a cell are manipulated below $V_{DD}$ and above ground, respectively. For example, both embodiments (A) and (C) may be combined such that a write operation to a particular cell causes the power supply thereto to be removably floated from $V_{DD}$ and ground to $V_H$ and $V_L$. Such a controlled "disturbance" is particularly suited to secure SRAM designs, where the cell data is almost non-disturbable. Likewise, a combination of embodiments (B) and (D) allows the cell voltage supply to be fixed at $V_H$ and $V_L$, while the bitline swing is from $V_{DD}$ to ground. Alternatively, the cell voltage may be fixed at $V_{DD}$ and ground while the bitlines are charged to levels higher than $V_{DD}$ and lower than ground.

Through the use of the disclosed method and apparatus embodiments, an SRAM array may take advantage of the benefits of having smaller PFET pass gates (e.g., better stability, lower power, higher density) while not sacrificing write performance. In addition, the reliable write performance is maintained even when the reverse beta ratio of the cell is less than 1.7.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for preparing a computer memory cell for a data write operation thereto, the memory cell having a cell supply voltage source connected at one end to pull-up devices within the memory cell and connected at an opposite end to pull-down devices within the memory cell, the memory cell further having and a pair of access transistors for selectively coupling the memory cell to a pair of complementary bitlines, the method comprising:

adjusting the voltage of the cell supply voltage source from a first voltage value to a second voltage value;

coupling the memory cell to the pair of complementary bitlines, thereby facilitating the data write operation; and following the data write operation, restoring the cell supply voltage from said second voltage value back to said first voltage value.

2. The method of claim 1, wherein said second voltage value is less than said first voltage value.

3. The method of claim 1, wherein:

said first voltage value corresponds to the pull-up devices within the memory cell being coupled to a logic supply voltage $V_{DD}$, and the pull-down devices within the memory cell being removably coupled to ground; and said second voltage value corresponds to the pull-down devices being floated up to a potential above ground, thereby reducing the magnitude of the voltage of the cell supply voltage source.

4. The method of claim 3, wherein said adjusting the voltage of the cell supply voltage from a first voltage value to a second voltage value further comprises:

deactivating a switching mechanism, said switching mechanism connected between the pull-down devices and ground;

said switching mechanism, when deactivated, thereby causing the pull-down devices to be floated up to said potential above ground.

5. The method of claim 4, wherein said switching mechanism further comprises:

a first NFET, configured as a switch; and a second NFET, configured as a diode, said second NFET having a gate terminal and a drain terminal connected to the pull-down devices;

wherein said potential above ground corresponds to a threshold voltage of said second NFET.

6. The method of claim 5, wherein said restoring the cell supply voltage from said second voltage value back to said first voltage value further comprises:

activating said switching mechanism;

said switching mechanism, when activated, thereby causing the pull-down devices to be coupled back to ground.

7. The method of claim 1, wherein:

said first voltage value corresponds to the pull-up devices within the memory cell being removably coupled to a logic supply voltage $V_{DD}$, and the pull-down devices within the memory cell being coupled to ground; and said second voltage value corresponds to the pull-up devices being floated down to a potential below $V_{DD}$, thereby reducing the magnitude of the voltage of the cell supply voltage source.

8. The method of claim 7, wherein said adjusting the voltage of the cell supply voltage from a first voltage value to a second voltage value further comprises:

deactivating a switching mechanism, said switching mechanism connected between the pull-up devices and $V_{DD}$;

said switching mechanism, when deactivated, thereby causing the pull-up devices to be floated down to said potential below $V_{DD}$.

9. The method of claim 8, wherein said switching mechanism further comprises:

a first PFET, configured as a switch; and a second PFET, configured as a diode, said second PFET having a gate terminal and a drain terminal connected to the pull-up devices;

wherein said potential below $V_{DD}$ corresponds to a threshold voltage of said second PFET.

10. The method of claim 9, wherein said restoring the cell supply voltage from said second voltage value back to said first voltage value further comprises:

activating said switching mechanism;

said switching mechanism, when activated, thereby causing the pull-up devices to be coupled back to $V_{DD}$.

11. A method for writing a data bit into a computer memory cell, the computer memory cell having a cell supply voltage source connected at one end to pull-up devices within the memory cell and connected at an opposite end to pull-down devices within the memory cell, the memory cell further having and a pair of access transistors for selectively coupling the memory cell to a pair of complementary bitlines, the method comprising:

charging the pair of complementary bitlines to a first voltage value, said first voltage value being greater than a second voltage value corresponding to the cell supply voltage source; and coupling the memory cell to the pair of complementary bitlines.

12. The method of claim 11, further comprising:

biasing the cell supply voltage connected at said one end to a high voltage value, $V_H$; and biasing the cell supply voltage connected at said opposite end to a low voltage value, $V_L$.

13. The method of claim 12, wherein said charging the pair of complementary bitlines to a first voltage value further comprises:

charging one of the pair of complementary bitlines to a voltage below $V_L$; and charging the other of the pair of complementary bitlines to a voltage equal to $V_H$.

14. The method of claim 13, wherein:

$V_L$ is biased to be above ground potential; and said charging one of the pair of complementary bitlines to a voltage below $V_L$ comprises coupling said one of the pair of complementary bitlines to ground.

15. The method of claim 13, wherein $V_L$ is biased to ground potential.

16. The method of claim 12, wherein said charging the pair of complementary bitlines to a first voltage value further comprises:

charging one of the pair of complementary bitlines to a voltage above $V_H$; and charging the other of the pair of complementary bitlines to a voltage equal to $V_L$.

17. The method of claim 16, wherein:

$V_H$ is biased to be below the potential of a logic power supply source having a voltage $V_{DD}$; and said charging one of the pair of complementary bitlines to a voltage above $V_H$ comprises coupling said one of the pair of complementary bitlines to $V_{DD}$.

18. The method of claim 16, wherein $V_H$ is biased to $V_{DD}$.

19. The method of claim 12, wherein said charging the pair of complementary bitlines to a first voltage value further comprises:

charging one of the pair of complementary bitlines to a voltage below $V_L$; and charging the other of the pair of complementary bitlines to a voltage above $V_H$.

20. The method of claim 19, wherein:

$V_L$ is biased to be above ground potential;

$V_H$ is biased to be below the potential of a logic power supply source having a voltage $V_{DD}$;

said charging one of the pair of complementary bitlines to a voltage below $V_L$ comprises coupling said one of the pair of complementary bitlines to ground; and said charging the other of the pair of complementary bitlines to a voltage above $V_H$ comprises coupling said other of the pair of complementary bitlines to $V_{DD}$.

21. A computer memory storage cell, comprising:

a pair of pull-up devices;

a pair of pull-down devices, said pair of pull-up devices and pull-down configured as a pair of cross-coupled inverters forming a data storage latch;

a cell supply voltage source connected at one end to said pull-up devices and connected at said opposite end said pull-down devices;

a pair of pass gates for selectively coupling said pair of cross-coupled inverters to a pair of complementary bitlines; and a switching mechanism, said switching mechanism configured to selectively adjust said cell supply voltage source from a first voltage value to a second voltage value.

22. The storage cell of claim 21, wherein said second voltage value is less than said first voltage value.

23. The storage cell of claim 21, wherein:

said pair of pull-up devices are coupled to a logic supply voltage $V_{DD}$, and said pair of pull-down devices are removably coupled to ground;

wherein said first voltage value corresponds to said pair of pull-down devices being coupled to ground, and said second voltage value corresponds to said pair of pull-down devices being uncoupled from ground.

24. The storage cell of claim 23, wherein:

said switching mechanism is connected between said pair of pull-down devices and ground;

said switching mechanism, when deactivated, thereby causing said pair of pull-down devices to be floated up to a potential above ground.

25. The storage cell of claim 24, wherein said switching mechanism further comprises:

a first NFET, configured as a switch; and a second NFET, configured as a diode, said second NFET having a gate terminal and a drain terminal connected to said pair of pull-down devices;

wherein said potential above ground corresponds to a threshold voltage of said second NFET.

26. The storage cell of claim 25, wherein:

said switching mechanism, when activated, causes said pair of pull-down devices to be coupled back to ground.

27. The storage cell of claim 21, wherein:

said pair of pull-up devices are removably coupled to a logic supply voltage $V_{DD}$, and said pair of pull-down devices are coupled to ground;

wherein said first voltage value corresponds to said pair of pull-up devices being coupled to $V_{DD}$, and said second voltage value corresponds to said pair of pull-up devices being uncoupled from $V_{DD}$.

28. The storage cell of claim 27, wherein:

said switching mechanism is connected between said pair of pull-up devices and $V_{DD}$;

said switching mechanism, when deactivated, thereby causing said pair of pull-up devices to be floated down to a potential below $V_{DD}$.

29. The storage cell of claim 28, wherein said switching mechanism further comprises:

a first PFET, configured as a switch; and a second PFET, configured as a diode, said second PFET having a gate terminal and a drain terminal connected to said pair of pull-up devices;

wherein said potential below $V_{DD}$ corresponds to a threshold voltage of said second PFET.

30. The storage cell of claim 29, wherein:

said switching mechanism, when activated, causes said pair of pull-up devices to be coupled back to $V_{DD}$.

31. A computer memory device, comprising:

an array of memory storage cells arranged in rows in columns, each of said memory storage cells further comprising:

a pair of pull-up devices;

a pair of pull-down devices, said pair of pull-up devices and pull-down configured as a pair of cross-coupled inverters forming a data storage latch;

a cell supply voltage source connected at one end to said pull-up devices and connected at said opposite end said pull-down devices;

a pair of pass gates for selectively coupling said pair of cross-coupled inverters to a pair of complementary bitlines; and a switching mechanism, said switching mechanism configured to selectively adjust said cell supply voltage source from a first voltage value to a second voltage value.

32. The computer memory device of claim 31, wherein said second voltage value is less than said first voltage value.

33. The computer memory device of claim 31, wherein:

said pair of pull-up devices are coupled to a logic supply voltage $V_{DD}$, and said pair of pull-down devices are removably coupled to ground;

wherein said first voltage value corresponds to said pair of pull-down devices being coupled to ground, and said second voltage value corresponds to said pair of pull-down devices being uncoupled from ground.

34. The computer memory device of claim 33, wherein:

said switching mechanism is connected between said pair of pull-down devices and ground;

said switching mechanism, when deactivated, thereby causing said pair of pull-down devices to be floated up to a potential above ground.

35. The computer memory device of claim 34, wherein said switching mechanism further comprises:
- a first NFET, configured as a switch; and
- a second NFET, configured as a diode, said second NFET having a gate terminal and a drain terminal connected to said pair of pull-down devices;
- wherein said potential above ground corresponds to a threshold voltage of said second NFET.

36. The computer memory device of claim 35, wherein:
- said switching mechanism, when activated, causes said pair of pull-down devices to be coupled back to ground.

37. The computer memory device of claim 31, wherein:
- said pair of pull-up devices are removably coupled to a logic supply voltage $V_{DD}$, and said pair of pull-down devices are coupled to ground;
- wherein said first voltage value corresponds to said pair of pull-up devices being coupled to $V_{DD}$, and said second voltage value corresponds to said pair of pull-up devices being uncoupled from $V_{DD}$.

38. The computer memory device of claim 37, wherein:
- said switching mechanism is connected between said pair of pull-up devices and $V_{DD}$;
- said switching mechanism, when deactivated, thereby causing said pair of pull-up devices to be floated down to a potential below $V_{DD}$.

39. The computer memory device of claim 38, wherein said switching mechanism further comprises:
- a first PFET, configured as a switch; and
- a second PFET, configured as a diode, said second PFET having a gate terminal and a drain terminal connected to said pair of pull-up devices;
- wherein said potential below $V_{DD}$ corresponds to a threshold voltage of said second PFET.

40. The computer memory device of claim 39, wherein:
- said switching mechanism, when activated, causes said pair of pull-up devices to be coupled back to $V_{DD}$.

* * * * *